United States Patent
Yano et al.

[11] Patent Number: 6,083,841
[45] Date of Patent: Jul. 4, 2000

[54] METHOD OF ETCHING GALLIUM-NITRIDE BASED COMPOUND SEMICONDUCTOR LAYER AND METHOD OF MANUFACTURING SEMICONDUCTOR LIGHT EMITTING DEVICE UTILIZING THE SAME

[75] Inventors: Hirohisa Yano; Jun Ichihara, both of Kyoto, Japan

[73] Assignee: Rohm Co., Ltd., Kyoto, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/079,261

[22] Filed: May 15, 1998

[30] Foreign Application Priority Data

May 15, 1997 [JP] Japan ..................................... 9-125168
May 15, 1997 [JP] Japan ..................................... 9-125169

[51] Int. Cl.$^7$ .................................................. H01L 21/302
[52] U.S. Cl. .............................. 438/706; 438/712; 216/66
[58] Field of Search ...................................... 438/706, 709, 438/710, 712; 216/17, 39, 41, 51, 62, 74, 75, 79, 66

[56] References Cited

U.S. PATENT DOCUMENTS

| | | | |
|---|---|---|---|
| 5,168,071 | 12/1992 | Fullowan et al. | 156/656 |
| 5,286,608 | 2/1994 | Koh | 216/67 |
| 5,693,963 | 12/1997 | Fujimoto et al. | 257/94 |
| 5,786,606 | 7/1998 | Nishio et al. | 257/103 |
| 5,789,265 | 8/1998 | Nitta et al. | 156/655.1 |
| 5,811,319 | 9/1998 | Koike et al. | 438/46 |
| 5,814,239 | 9/1998 | Kaneko et al. | 438/715 |
| 5,840,200 | 11/1998 | Nakagawa et al. | 438/722 |

*Primary Examiner*—Benjamin L. Utech
*Assistant Examiner*—Duy-Vu Deo
*Attorney, Agent, or Firm*—Arent Fox Plotkin Kintner & Kahn

[57] ABSTRACT

A GaN-based compound semiconductor layer is formed on a substrate. An etch mask of a Ti film is formed on a surface of said gallium-nitride based compound semiconductor. The gallium-nitride based compound semiconductor is selectively etched through an opening of said etch mask. With this method, even where the semiconductor is difficult to etch, it is possible to efficiently etch the semiconductor vertically relative to a surface thereof by once forming a mask without troubles such as stripping-off of a mask. If the etch mask uses a metal film easy to oxidize to perform etching on the semiconductor layer while supplying an oxidizing source, the selective etch ratio can be further increased, enabling etching by a thin etch film.

5 Claims, 3 Drawing Sheets

METHOD OF ETCHING GALLIUM-NITRIDE BASED COMPOUND SEMICONDUCTOR LAYER AND METHOD OF MANUFACTURING SEMICONDUCTOR LIGHT EMITTING DEVICE UTILIZING THE SAME

BACKGROUND OF THE INVENTION

This invention relates to a method of etching a semiconductor layer such as of a gallium-nitride based compound semiconductor, and a method of manufacturing a semiconductor light emitting device.

Conventionally, semiconductor light emitting devices, such as light emitting diodes (hereinafter called LEDs) and laser diodes, are manufactured by forming a compound semiconductor layer to provide a light emitting layer. Where performing dry etching on part of the formed semiconductor layer during manufacturing such a device, a mask with an opening is formed to carry out etching the semiconductor layer exposed by the opening through a reactive ion etching (RIE) process or CAIBE (Chemical-Assisted Ion Beam Etching) process.

The conventional method of etching a GaAs-based compound semiconductor layer formed on a GaAs substrate is carried out by using a three-layer resist process. That is, a phtoresist hard-baked layer 22 is formed in a thickness of approximately 1 μm on a GaAs semiconductor layer 21 (wherein a photoresist material is applied and baked at approximately 200° C.), as shown in FIG. 3(a). A Ti film 23 is then formed on the hard-baked layer 22 by sputtering or the like to a thickness of approximately 1000 angstroms. A photoresist layer 24 is further formed to a thickness of approximately 1.5 μm on the Ti film 23. The photoresist layer 24 is patterned to provide an opening at a location to perform etching by a usual photolithographic process.

Then, the Ti film 23 is etched by an RIE process utilizing the patterned photoresist layer 24 as a mask to thereby provide an opening in the Ti film 23, as shown in FIG. 3(b). Thereafter, the photoresist layer 24 and the photoresist hard-baked layer 22 at an exposed portion are removed by an oxygen plasma to thereby expose a portion to be etched of the GaAs semiconductor layer 21, as shown in FIG. 3(c). Then, the GaAs semiconductor layer 21 is etched by a CAIBE process utilizing the Ti film 23 as a mask, as shown in FIG. 3(d). Thereafter, the photoesist hard-baked layer 22 is removed by a solvent such as an NaOH solution, removing the Ti film 23 at the same time. Thus, a GaAs semiconductor layer 21 is provided that is etched at required portion thereof.

Where etching a GaAs compound semiconductor as stated above by the CAIBE process, the selective etch ratio can be taken great for Ti and GaAs. Accordingly, the GaAs layer can be etched to a sufficient extent by using Ti as a mask. However, where etching a recently-developed gallium-nitride based compound semiconductor such as GaN, it is difficult for GaN to provide a great selective etch ratio with respect to Ti, different from the case of GaAs. That is, the selective etch ratio for GaN is given about a ⅓ or less of the GaAs case. This requires a thickness of a Ti-mask film of approximately 2.5 μm in order to etch, for example, GaN by approximately 5 μm. However, a Ti film, when its thickness exceeds 0.2 μm or thicker, worsens in adhesion to a photoresist hard-baked layer, resulting in stripped off. Thus, there is a problem of difficulty for a Ti mask to employ as a mask for etching a gallium-nitride based compound semiconductor.

Meanwhile, where performing etching using a photoresist layer as a mask, since the photoresist layer is further lower in selective etch ratio as compared to Ti. Accordingly, there is a necessity of increasing the mask thickness or reapplying a phtoresist layer in the course of etching. If the photoresist layer is formed thick, the verticality lowers at an opening, resulting in a tapered form. Thus, there is a problem of difficulty in vertically etching the gallium-nitride based compound semiconductor layer.

SUMMARY OF THE INVENTION

It is an object of the preset invention to provide a method of etching a gallium-nitride based compound semiconductor layer which can carry out efficiently etching a gallium-nitride based compound semiconductor layer vertically relative to a surface thereof by once forming a thin mask in a manner free of troubles such as stripping off of a mask.

It is another object of the present invention to provide a method that can etch a semiconductor layer, through the use of a thin etch mask even where the semiconductor layer, such as a gallium-nitride compound semiconductor layer, is difficult to increase in selective etch ratio relative to an etch mask material.

It is further object of the present invention to provide a method of manufacturing a semiconductor light emitting device utilizing this etch method.

A method of etching a gallium-nitride based compound semiconductor layer according to the present invention, comprises the steps of: forming a gallium-nitride based compound semiconductor layer on a substrate; forming an etch mask of a Ti film on a surface of the gallium-nitride based compound semiconductor; and selectively etching the gallium-nitride based compound semiconductor layer through an opening of the etch mask.

Here, the gallium-nitride based compound semiconductor is a semiconductor formed of a compound having a group-III element Ga and a group-V element N wherein part of the group-III element Ga may be substituted by other group-III elements such as Al and In, and/or part of the group-V element N may be substituted by other group-V elements such as P and As.

The etch mask may be formed directly on the gallium-nitride based compound semiconductor layer. By doing so, it is possible to provide the Ti film with a thickness sufficient for etching the gallium-nitride based compound semiconductor layer without fear of stripping-off of the mask.

The Ti film may be removed by using a hydrofluoric acid solution after completing the etching. By doing so, it is possible to remove only the Ti film without giving damages to the gallium-nitride based compound semiconductor layer.

In another form of a method of etching a gallium-nitride based compound semiconductor layer of the present invention, comprises the steps of: forming a semiconductor layer on a substrate; forming an etch mask of a metal film easy to oxidize on a surface of the semiconductor layer; selectively etching the semiconductor layer through an opening of the etch mask while supplying an oxidizing source to cause the metal film to oxidize.

Here, the oxidizing source means a gas, an ion or the like, such as oxygen, ozone, $N_2O$, a radical ion source, etc., which can cause a material to be oxidized.

The etching may be dry etching having an effect of physical etching with using a corpuscular beam. This is particularly preferred because the etch mask is easy to oxidize. Here, the corpuscular beam means a beam of corpuscles such as an ion beam, an atomic beam, a molecular beam, etc.

The metal film used as the etch mask may be a Ti film. With this film, it is possible to increase the selective etch ratio relative to the semiconductor layer. The selective etch ratio can be further increased by oxidizing the Ti film. Therefore, the semiconductor layer if thick can be etched through the use of a thin etch mask. In particular, where the semiconductor layer is a gallium-nitride based compound semiconductor layer, the etch-difficult gallium-nitride based compound semiconductor layer if formed thick can be preferably etched through a thin etch mask.

A method of manufacturing a semiconductor light emitting device according to the present invention, comprising the steps of: forming a gallium-nitride based compound semiconductor layer constituting a light emitting layer forming portion including a first conductivity type layer and a second conductivity type layer; forming a Ti film on a surface of the semiconductor layer; forming a photoresist layer on the Ti film; patterning the photoresist layer to open an area for etching the semiconductor layer; etching to open the Ti film at a portion exposed by the opening in the photoresist layer; etching to open the gallium-nitride based compound semiconductor layer at a portion exposed by the opening in the Ti film; thereafter, removing the Ti film by a hydrofluoric acid solution; and forming first electrode and second electrode such that they are respectively in electric contact with the first conductivity layer and the second conductivity layer of the semiconductor layer.

The gallium-nitride based compound semiconductor layer may be etched while supplying an oxidizing source to a surface of the Ti film. This is preferred because the selective etch ratio can be taken great relative to the semiconductor layer and accordingly etcing is possible by a thin etching film.

DETAILED DESCRIPTION

The present inventors have found that, even where forming a Ti film directly on a gallium-nitride based compound semiconductor layer, the Ti film can be etch-removed by using an appropriate concentration of a hydrofluoric acid solution as a solvent without giving any damage to the gallium-nitride based compound semiconductor layer. Even where a Ti film is formed to a thickness of as thick as approximately 2 $\mu$m without forming a photoresist baked hard layer, the Ti film does not raise a problem such as of stripped off or the like. Thus, the present inventors completed the present invention that a Ti film is used as a mask for etching a gallium-nitride based compound semiconductor. This method enables a Ti film to be stably formed comparatively thick. However, there is a problem that, where the selective etch ratio cannot be largely increased with respect to the gallium-nitride based compound semiconductor, the etch mask, if excessively thick, makes vertical etching difficult to perform. Under such a circumstance, the present inventor has further studied to complete another form of an etching method to carry out etching with a thinned etch mask even where the selective etch ratio is difficult to increase to a considerable extent.

Now, explanations will be made on a method of etching a gallium-nitride based compound semiconductor layer according to the present invention, and a method of manufacturing a semiconductor light emitting device utilizing the same, with reference to the drawings.

Figure 1:
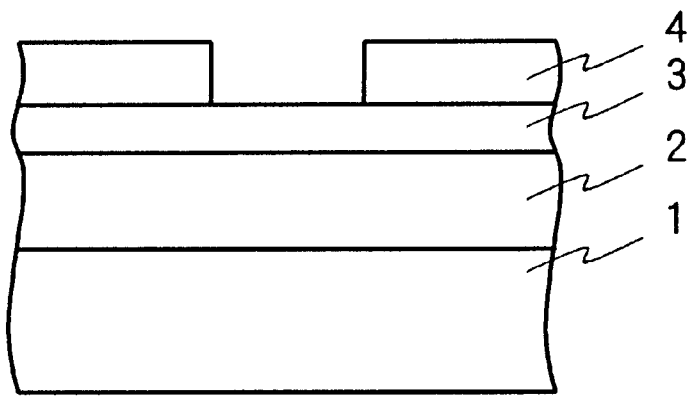
FIGS. 1(a) to 1(c) are process explanatory views for explaining an etching method according to one embodiment of the present invention.
Figure 1:
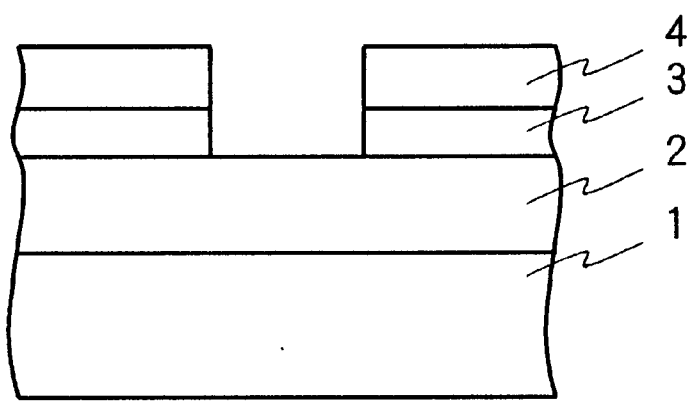
Figure 1:
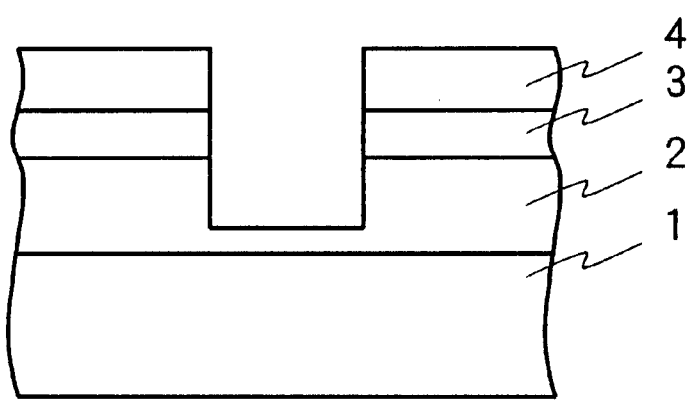

Referring first to FIG. 1(a), a gallium-nitride based compound semiconductor layer 2 is formed on a substrate 1 of sapphire or the like. The gallium-nitride based compound semiconductor layer 2 includes a first conductivity type (e.g. p-type) layer and a second conductivity type (e.g. n-type) layer so as to constitute a light emitting layer forming portion. A Ti film 3 is further formed on the semiconductor layer 2. Further, a photoresist layer film 4 is formed on the Ti film 3. This Ti film 3 is formed to a thickness of approximately 0.5–5 $\mu$m, for example, by a sputter or vacuum deposition method. On the other hand, the photoresist layer 4, as a usual etch mask, is formed in a thickness of approximately 1–2 $\mu$m by applying a photoresist material and then curing the same at a temperature of approximately 110–120 C. The photoresist layer 4 is then patterned to provide an opening at a location corresponding to a region to be etched of the semiconductor layer 2.

The Ti film 3 is then etched by an RIE process utilizing the patterned photoresist layer 4 as a mask to thereby expose the semiconductor layer 2 at a portion to be etched, as shown in FIG. 1(b). This RIE process etching is carried out in a gaseous atmosphere of $Cl_2$, $CF_4$ and $N_2$ under plasma discharge.

Then, the gallium-nitride based compound semiconductor layer 2 is etched by a chemical-assisted ion beam etching (CAIBE) process, wherein a $Cl_2$ gas is employed as an assisting gas to accelerate an Ar beam at a voltage of 600 V while utilizing the photoresist layer 4 and the Ti film 3 as masks, as shown in FIG. 1(c).

The photoresist layer 4 thus etch-processed is then removed away, though not shown, by an asher (02 plasma) or an organic solvent such as acetone. Thereafter, the Ti film 3 etched is removed away by a hydrofluoric acid solution. According to experimental removal of the Ti film 3 using a hydrofluoric acid, the Ti film was not completely removed by immersion in a buffered hydrofluoric acid solution (BHF, 16 wt. %) for as long as 6 minutes. However, the Ti film could be completely stripped off as fast as 5 second, when immersed in a 50 wt. 1s hydrofluoric acid solution. It is noted that, even where the immersion in the hydrofluoric acid solution is continued after the Ti film has stripped away, i.e. immersion for 15 seconds, no damages were observed at the surface of the gallium-nitride based compound semiconductor layer. It was thus found that, if the Ti film mask is removed by a hydrofluoric acid solution with a concentration of 20–50 wt. %, the Ti film only can be removed without causing any damage to the gallium-nitride based compound semiconductor layer. It is therefore possible to provide a Ti film as a mask directly on the gallium-nitride based compound semiconductor layer, as explained above.

According to this etching method, since a Ti film is provided as a mask directly on a surface of a gallium-nitride based compound semiconductor film, the Ti film, if the semiconductor layer is formed thick, does not give rise to a problem such as of stripped off of the Ti film. Therefore, it is possible to form a Ti film in a thickness of approximately 2 $\mu$m in order to sufficiently etch a gallium-nitride based compound semiconductor layer of as thick as approximately 5 $\mu$m without raising any problem. Also, there is no possibility of causing damages to the gallium-nitride based compound semiconductor layer by a hydrofluoric acid solution used to etch a Ti film directly formed on the gallium-nitride based compound semiconductor layer.

Now, explanations will be made on an example of a second etching method that can etch a gallium-nitride based compound semiconductor layer by using a Ti film as a etch mask despite the Ti film is comparatively thin. This process will be explained also with reference to FIGS. 1(a)–1(c), wherein explanations will be based on processes different from those of the above embodiment with the common process omitted.

First, on a substrate 1 are formed a gallium-nitride based compound semiconductor layer 2, a Ti film 3, and a photoresist layer 4 in this order, so that the photoresist layer 4 is patterned, similarly to the FIG. 1(a) example. On this occasion, the Ti film 3 is formed in a thickness of approximately 0.5–1 μm thinner than that of the above embodiment.

Then, the Ti film 3 is partly etched to expose the semiconductor layer 2, similarly to the FIG. 1(b) example.

Thereafter, the gallium-nitride based compound semiconductor layer 2 is etched by utilizing the patterned photoresist layer 4 and the Ti film 3 as a mask by the CAIBE process, similarly to the process of FIG. 1(c). During this etching, the Ti film 3 at its exposed surface is oxidized into $TiO_2$ by oxygen being supplied, becoming resistive to etching higher than the Ti film 3. More specifically, the Ti film 3 being etched at its surface is activated and ready to oxidize. This surface is oxidized by being blown (supplied) by oxygen, and becomes resistive to etching. Thus, the selective etch ratio of the same film to the gallium-nitride based compound semiconductor layer is increased to about 12 from the ratio of about 2 to the Ti film.

Thereafter, the residual photoresist layer and the Ti film are removed away, though not shown. On this occasion, although the Ti film oxidized is resistive to hydrofluoric acid attack, once the $TiO_2$ surface is opened, the Ti portion of the film lying thereunder is instantaneously etched. Thus the Ti film 3 is easily etched by hydrofluoric acid.

According to the second etching method, the semiconductor layer is etched while oxidizing the etch mask Ti film. The resulting $TiO_2$ portion of the film is resistive to etching as compared to the Ti film. This serves to reduce the waste of the Ti film during etching a semiconductor layer, such as a gallium-nitride based compound semiconductor layer, difficult to be etched. In this manner, it is possible to etch a gallium-nitride based compound semiconductor layer having a thickness of as thick as 5 μm or greater by using a Ti film having a thickness of as thin as approximately 0.5 μm, i.e. approximately ⅙ thick as compared to a usual Ti etch-mask film. Thus, the etch mask can be greatly reduced in thickness, and the residual etch mask is easy to remove away. Thus, patterning accuracy is improved to enable precise etching and vertical etching.

In the above example of the second etching method, a Ti film was employed as an etch mask. Besides the Ti film, it is possible to use such a metal provided that it is easy to oxidize to have increased etch resistance when oxidized. For example, Cr and Al, when oxidized, respectively turn into chromium oxide and $Al_2O_3$ having a higher etch resistance as compared to their pure form. These metals can be employed as an etch mask material. In dry etch involving physical etch factors such as ion milling, an oxide metal is generally higher etch resistive than a pure metal form. It is therefore possible to use a metal provided that it is easy to oxidize, including Zr and Ta. Meanwhile, instead of oxygen blowing (supply) may be used an oxidizing gas including an oxidizing source such as ozone, $N_2O$, a radical ion source or the like.

Now, explanations will be made on a method of manufacturing a semiconductor light emitting device having gallium-nitride based compound semiconductor layers to emit bluish light.

Figure 2:
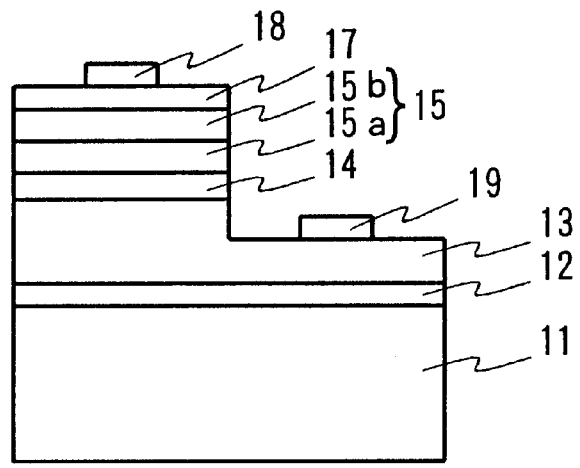
FIG. 2 is a sectional explanatory view of a bluish-light semiconductor light emitting device chip manufactured by the etching method of the present invention.
Figure 3:
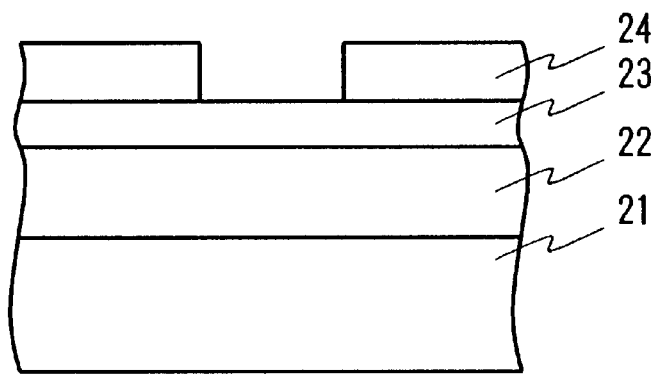
FIGS. 3(a) to 3(d) are process explanatory views of an example to etch a conventional GaAs-based compound semiconductor layer.
Figure 3:
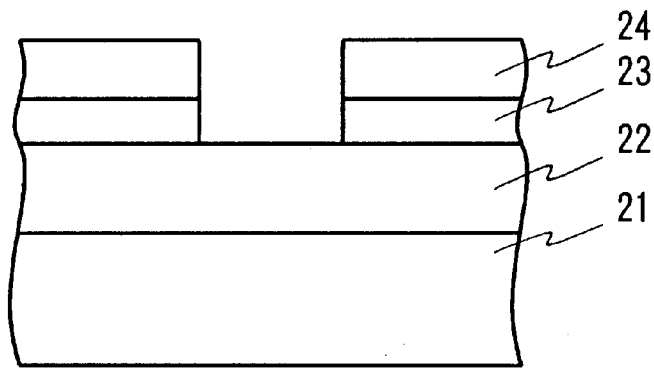
Figure 3C:
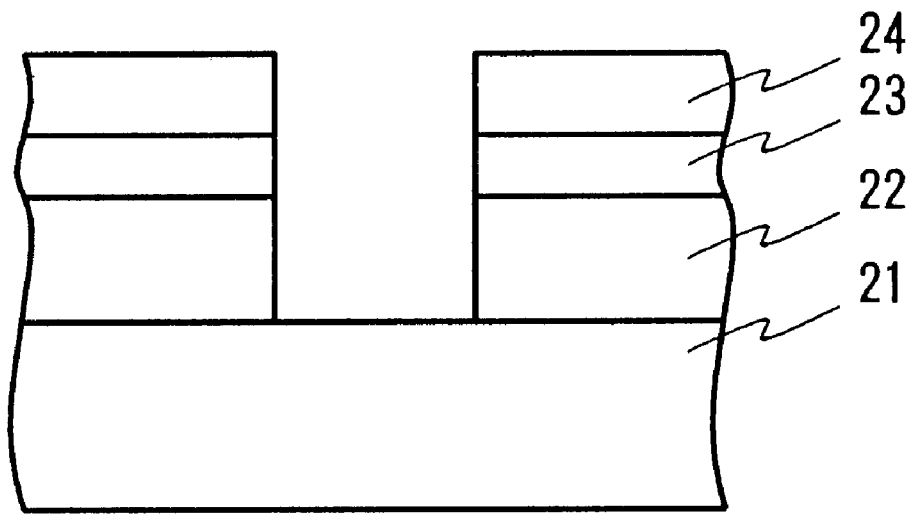
Figure 3D:
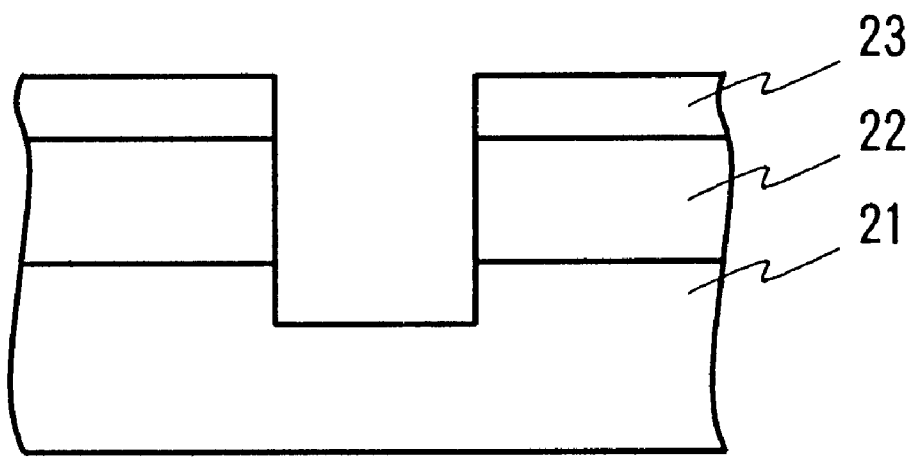

A semiconductor light emitting device for emitting bluish light includes gallium-nitride based compound semiconductor layers formed, for example, by an organic-metal chemical vapor deposition (MOCVD) growth process, as illustrated as one example of an LED chip in FIG. 2. That is, on a surface of a substrate 11 of sapphire ($Al_2O_3$ single crystal) or the like is deposited a low-temperature buffer layer 12 to a thickness of approximately 0.01–0.2 μm. Subsequently, an n-type (cladding) layer 13 is deposited of an n-type GaN to a thickness of approximately 1–5 μm on the buffer layer 12. Further, an active layer 14 is formed of such a material, e.g. an InGaN-based compound semiconductor, that is low in bandgap energy than that of the cladding layer, to a thickness of approximately 0.05–0.3 μm. On the active layer 14 is formed to a thickness of approximately 0.2–1 μm a p-type (cladding) layer 15 having an AlGaN-based compound semiconductor layer 15a (wherein the "AlGaN-based" means a composition having Al and Ga variable in ratio) and a GaN layer 15b.

Thereafter, a Ti film is formed by a vacuum evaporation to a thickness of approximately 0.5–3 μm (or approximately 0.5–1 μm where the above-stated second etching method is applied) on a surface of the semiconductor layers thus formed, in order to expose the n-type layer 13 underlying the semiconductor layers. Note that this process, though not illustratively shown, is carried out in a manner similar to the way as explained in FIG. 1. Then, a photoresist layer is formed and patterned to provide an opening at an area of a surface of the semiconductor layers to be etched. The Ti film is then opened by an RIE process utilizing the patterned photoresist layer as a mask. Using this mask, the semiconductor layers are etched by a CAIBE process using a $Cl_2$ gas as an assisting gas to thereby partly expose the n-type layer 13. In the case of applying the second etching process, the semiconductor layers are etched while supplying an oxidizing source. Then, the Ti film is removed away by using a 50 wt. % hydrofluoric acid.

Thereafter, Ni and Au are evaporated on a surface of the p-type layer 15, and sintered into a metal layer, providing a current diffusion layer 17 in a thickness of approximately 2–100 nm.

Then, metals of Ti and Al are respectively formed by vacuum evaporation or the like to thickness of 0.1 μm and 0.3 μm on the exposed surface of the n-type layer 13, followed by being sintered in order to provide an n-side electrode. On the other hand, a protecting layer of SiN or the like, not shown, is partly removed to vacuum evaporate Ti and Au to form a p-side electrode 18. Thereafter, the wafer under processing is divided into individual LED chips.

Incidentally, the above-stated p-type layer 15 is of a double-layered structure having the GaN layer and the AlGaN-based compound semiconductor layer. This is because the p-type layer 15 preferably has an Al-containing layer in order to enhance carrier confinement. The p-type layer 15 may be constituted only by the GaN single layer. Meanwhile, the n-type layer 13 may be formed by a double-layered structure having an AlGaN-based compound semiconductor layer, wherein these layers may be formed by a gallium-nitride compound semiconductor layer other than an AlGaN-based one. Further, although the above embodiment was of a doublehetero structure having an active layer sandwiched between an n-type layer and a p-type layer, the device may be formed by a pn-junction structure having a junction of n-type and p-type layers.

Although the above embodiment was on a bluish-light LED, the etching method of the invention is effectively applicable also to bluish-light laser diodes requiring exact depth and verticality during etching reflective end faces thereof. Also, the above embodiments employed gallium-nitride compound semiconductors as semiconductor layers, the inventive method is also applicable for etching other semiconductor layers such as GaAs, thereby enabling a thick semiconductor layer through the use of a thin etch mask.

According to the present invention, a Ti film can be used as an etch mask to etch a gallium-nitride based compound semiconductor. The Ti film can be formed in a thickness sufficient for etching a gallium-nitride based compound semiconductor. Further, the etch mask can be formed thin as compared to a photoresist layer or the like. Thus, the method of the invention enables vertical etching without rounding shoulders in etched material, realizing efficient and accurate etching.

According to the second etching method, an etch mask can be formed very thin, reducing cost and facilitating mask removal after etching. This offers cost down for manufacturing semiconductor devices. Further, since the etch mask can be formed very thin, patterning is easy and accurate etching is possible. In particular, the invention is effective to form a deep vertical surface for a bluish-light semiconductor laser at reflective end faces thereof.

What is claimed is:

1. A method of etching a gallium-nitride based compound semiconductor layer, comprising the steps of:

forming a gallium-nitride based compound semiconductor layer on a substrate;

forming an etch mask of a metal film easy to oxidize on a surface of said gallium-nitride based compound semiconductor layer; and selectively etching said gallium-nitride based compound semiconductor layer through an opening of said etch mask while supplying an oxidizing source to cause said metal film to oxidize wherein the etching is a dry etching having an effect of physical etching with using a corpuscular beam.

2. An etching method according to claim 1, wherein said etch mask is formed directly on said gallium-nitride based compound semiconductor layer.

3. An etching method according to claim 1, wherein said Ti film is removed by using a hydrofluoric acid solution after completing the etching.

4. An etching method according to claim 1, wherein said metal film used as said etch mask is a Ti film.

5. A method of manufacturing a semiconductor light emitting device, comprising the steps of:

forming a gallium-nitride based compound semiconductor layer constituting a light emitting layer forming portion including a first conductivity type layer and a second conductivity type layer;

forming a Ti film on a surface of said semiconductor layer;

forming a photoresist layer on said Ti film;

pattering said photoresist layer to open an area for etching said semiconductor layer;

etching to open said Ti film at a portion exposed by said opening in said photoresist layer;

etching to open said gallium-nitride based compound semiconductor layer at a portion exposed by said opening in said Ti film wherein the etching is a dry etching having an effect of physical etching with using a corpuscular beam, wherein said gallium-nitride based compound semiconductor layer is etched while supplying an oxidizing source to a surface of said Ti film;

thereafter, removing said Ti film by a hydrofluoric acid solution; and forming first electrode and second electrode such that they are respectively in electric contact with said first conductivity layer and said second conductivity layer of said semiconductor layer.

* * * * *